United States Patent
Byers et al.

(10) Patent No.: US 6,735,089 B1
(45) Date of Patent: May 11, 2004

(54) ELECTRONIC CIRCUIT CARD EJECTOR HANDLE THAT PROVIDES VISUAL STATUS INDICIA

(75) Inventors: Charles Calvin Byers, Wheaton, IL (US); Todd Keaffaber, Plano, IL (US); Andrew F. Scott, North Aurora, IL (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 10/403,478

(22) Filed: Mar. 31, 2003

(51) Int. Cl.[7] .............................. H05K 5/00; H05K 5/04; H05K 5/06; H05K 7/00
(52) U.S. Cl. ................. 361/754; 361/747; 361/755; 361/759; 362/85; 362/551
(58) Field of Search ................ 361/724–733, 361/740, 741, 747, 754, 756, 759, 796–798, 800, 801, 807, 755, 683–686; 362/85, 89, 132, 133, 234, 253, 551, 554, 560

(56) References Cited

U.S. PATENT DOCUMENTS

| | | | | |
|---|---|---|---|---|
| 5,627,379 A | * | 5/1997 | Bortolini | 250/551 |
| 6,231,224 B1 | * | 5/2001 | Gamble et al. | 362/551 |
| 6,431,718 B1 | * | 8/2002 | Gamble et al. | 362/85 |

* cited by examiner

*Primary Examiner*—Phuong T. Vu

(57) ABSTRACT

An ejector handle mounted to an electronic circuit card provides leverage to assist in engaging and disengaging the electronic circuit card from engagement with an electronic shelf. The ejector handle transmits light, such as by using light pipes, from an end of the handle adjacent to the faceplate of the electronic circuit card to a distal end of the handle where the transmitted light exits for viewing by maintenance personnel. A visual indicator assembly on the electronic circuit card supplies the sources of light that are coupled to and transmitted through the ejector handle. Indicia on the surface of the ejector handle identifies the corresponding function of the lights.

19 Claims, 2 Drawing Sheets

ELECTRONIC CIRCUIT CARD EJECTOR HANDLE THAT PROVIDES VISUAL STATUS INDICIA

BACKGROUND

This invention relates generally to electronic circuit cards (boards) and more specifically relates to visual indicators that provide information concerning the status of conditions or functions of an associated electronic circuit card.

Electronic circuit cards are generally well known. One common type of electronic circuit card is designed to be inserted into an electronic rack or shelf and has rear edge connectors that engage corresponding connectors on a backplane. Because of the force that must be applied to the electronic circuit card to disengage its rear edge connectors, various types of ejector handles mounted to a front panel of the electronic circuit card have been utilized to provide additional mechanical leverage. A substantial number of electronic circuit cards are typically contained in a shelf. An enclosure may contain a plurality of shelves thereby holding a large number of electronic circuit cards.

An important design consideration of electronic circuit cards is the ability to convey to maintenance personnel information concerning the status of conditions and/or functions of the electronic circuit card. This information is typically conveyed by the use of visual indicators, such as light emitting diodes (LEDs), mounted to the front panel of the electronic circuit card. Some cards may also utilize front panel mounted connectors used to connect the card via a multiple wire cable to other electronics. The front panel may also contain a plurality of switches, jacks, and openings to permit adjustments and selections to be made by maintenance personnel. The various status indicators and controls must be highly visible and unambiguous in order to reduce the chances of craft errors, such as removing the wrong card, from adversely affecting system reliability.

The front panels of some electronic circuit cards are becoming congested. The use of mezzanine boards, also known daughter boards, places additional demands on the need for the faceplate space of the electronic circuit cards. The increasing congestion places constraints on the number of visual indicators that can be accommodated and on locations where the visual indicators can be placed. An additional consideration associated with the visual indicators is the text or symbol that serves as a label and is normally screen printed on the front panel adjacent each indicator. The label may occupy more area on the front panel than the indicator itself. Various identifying labels containing information about manufacturers, model numbers, serial numbers, and barcodes further congest the front panel. With increasingly less space available on the front panel of electronic circuit cards, there exists a need for better utilization of space used for visual indicators.

SUMMARY OF THE INVENTION

It is an object of the present invention to satisfy the need for better utilization of space for visual indicators associated with electronic circuit cards.

In accordance with an embodiment of the present invention, an ejector handle adjacent to the front of the faceplate mounted to an electronic circuit card transmits light received at an end of the handle adjacent the faceplate to a distal end of the handle that is disposed to be seen by maintenance personnel with the electronic circuit card in operation. The light may be transmitted by a first light pipe that terminates at the distal end of the handle at a lens or frosted end of the light pipe to enhance the visibility and/or dispersion of transmitted light A second light pipe aligned to transmit light to the first light pipe couples light emitted from a light source on the printed circuit card. A plurality of first and second light pipes permits the ejector handle to carry a plurality of visual indicators. Labels associated with the visual indicators can be placed on a surface of the ejector handle in proximity to the visual indicator.

DESCRIPTION OF EMBODIMENTS

Figure 1:
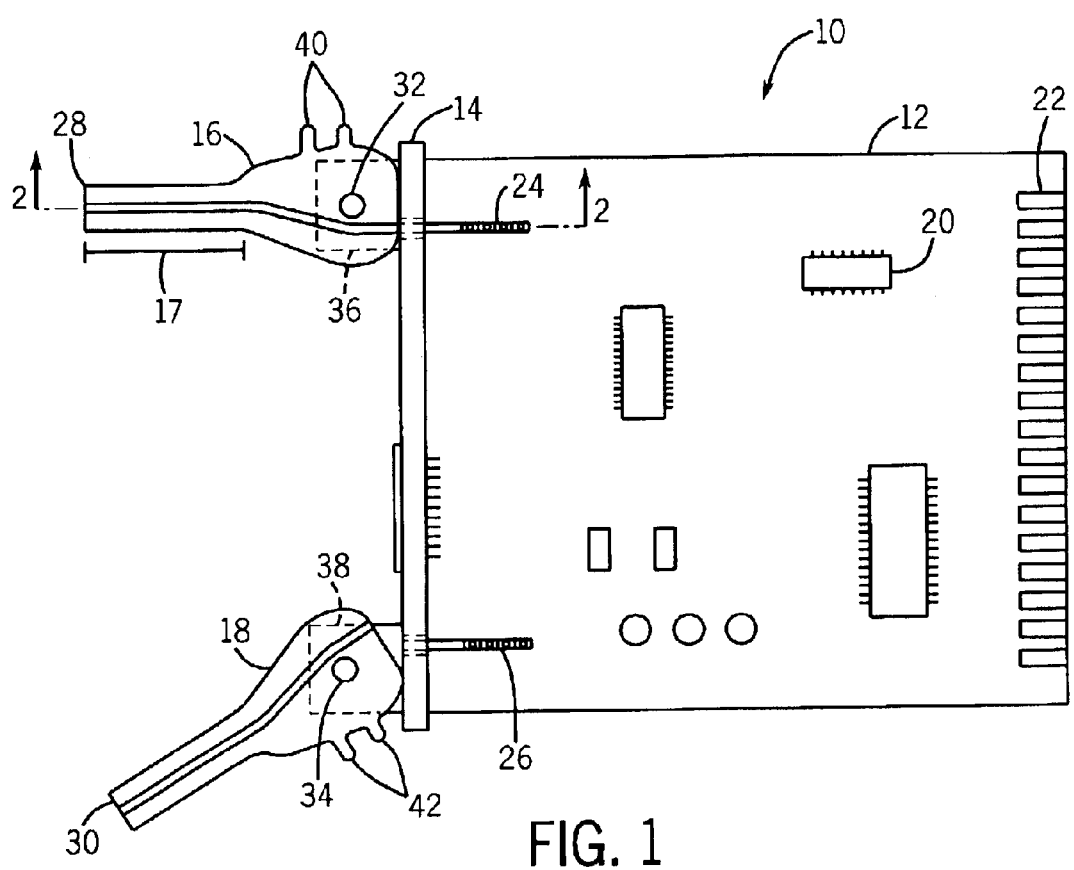
FIG. 1 is a side elevational view of an electronic circuit card with a faceplate and ejector handles in accordance with an embodiment of the present invention.

Referring to FIG. 1, an embodiment of the present invention includes an assembly 10 consisting of electronic circuit card 12, a faceplate 14 and ejector handles 16 and 18. A plurality of electronic components 20 that may include both active and passive devices are mounted to the electronic circuit card 12. The rear of the card contains a plurality of edge mounted connectors 22 disposed to engage corresponding connectors on a backplane (not shown) when the assembly 10 is mounted in an electronic shelf, typically with a plurality of other such assemblies. The electronic circuit card 12 and the faceplate 14 support visual indicator assemblies 24 and 26 that transmit visual indication lights to ejector handles 16 and 18, respectively.

As shown in FIG. 1, ejector handle 16 is in a position that it will normally assume when the assembly 10 is seated within an electronic shelf with the edge connectors 22 engaging the corresponding connectors on the backplane. The ejector handle 16 includes a handle portion 17. In this position the distal end 28 of the ejector handle 16 is disposed to point substantially away from the faceplate 14 so that the distal end 28 will easily be observed by maintenance personnel looking at the front of faceplate 14. The ejector handle 18 is shown in the position that it will normally assume when the assembly 10 is not seated within an electronic shelf, i.e. when the edge connectors 22 are not engaging the corresponding connectors on the backplane. In this position its distal end 30 does not point directly away from the front of faceplate 14. As will he appreciated by those skilled in the art, handles 16 and 18 will both normally be in the same position, i.e. either pointing substantially away from the faceplate 14 when the assembly 10 is seated and assembly IO is operational, or pointing at an angle with regard to the faceplate 14 when the assembly IO is not seated. The ejector handles 16 and 18 pivot about pins (not shown) disposed in apertures 32 and 34, respectively, with the pins supported by mounting brackets 36 and 38, respectively. The apertures 32 and 34 are examples of means associated with the body of the ejector handle for facilitating movement of the body relative to the electronic shelf. The mounting brackets are attached to the faceplate 14. Teeth 40 and 42 on handles 16 and 18, respectively, are disposed to engage a fixed member associated with the electronic shelf to provide maintenance personnel with leverage to move the assembly 10 left as shown in FIG. 1 as the ejector handles are rotated from the seated position as represented by handle 16 to the not seated position as represented by handle 18.

The teeth are examples of means for engaging the electronic shelf in order to generate leverage from the electronic circuit card relative to the shelf. Of course, other mechanical designs can be used to provide such engagement and leverage.

Figure 2:
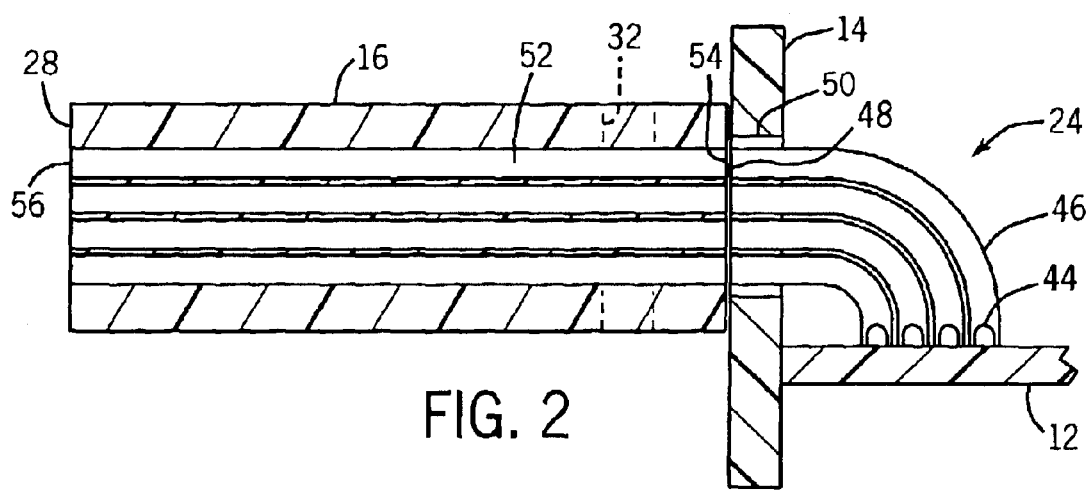
FIG. 2 is a cross-sectional view taken about line 2—2 in FIG. 1.

Referring to FIG. 2, visual indicator assembly 24 includes a plurality of light sources 44 such as LEDs mounted to electronic circuit card 12. Each light source is coupled to a corresponding light pipe 46 with a distal end 48 that preferably terminates at the front surface of faceplate 14 after passing through an opening 50 in the faceplate. Advantageously, light pipe 46 includes a 90 degree bend, permitting the use of standard high intensity surface mount LEDs. Light pipe 52 in ejector handle 16 preferably has one end 54 in optical alignment with distal end 48 of light pipe 46. The other end 56 of light pipe 52 terminates at distal end 28 of the ejector handle 16 and preferably includes a treatment to maximize the visibility of light exiting from light pipe 52. The treatment may include frosting or beveling of the end 56 of the light pipe, or may comprise the use of a lens or dispersion enhancing texture associated with end 56. The air gap, if any, between end 54 of light pipe 52 and end 48 of light pipe 46 should be minimized in order to maximize the amount of light teaching end 56. Optical elements, such as collomination lenses can be applied to light pipe ends 48 and 54 to enhance the light coupling efficiency. As best seen in FIG. 2 the illustrative embodiment includes three additional light pipes in the ejector handle 16 parallel to light pipe 52. The visual indicator assembly 24 will preferably contain the same number of light pipes as disposed in ejector handle 16 with a distal end of each of the light pipes in assembly 24 aligning with a corresponding end of a light pipe in ejector handle 16. Preferably, a separate light source is connected to each of the light pipes in assembly 24. Each light source may emit a different color of light or may be controlled by circuitry on card 12 to selectively emit different colored light depending on the status of the condition or function to be represented. Further, the light sources can be pulsed ON and OFF at different rates to provide indications of different conditions. The light pipes on ejector handle 16 and 18 may each represent a visual indication of a condition or status of a different function. The materials for light pipes 44, 52 and the three additional light pipes parallel to them, as well as the material comprising the handle body 16 are selected to insure isolation between the plurality of optical paths.

The light pipes may each comprise a separate conventional light pipe. However, the light pipes, especially those in the ejector handle 16, may comprise other means for transmitting light through the handle. For example, the handle may be made of a material suited for the transmission of light with separate light pipes being defined by boundary surfaces that reflect or redirect light. The boundary surfaces can be reflective such as a silvered surface or could comprise the use of other materials with a different index of a fraction so that light inside the defined light pipe will tend to stay within the light pipe.

Figure 3:
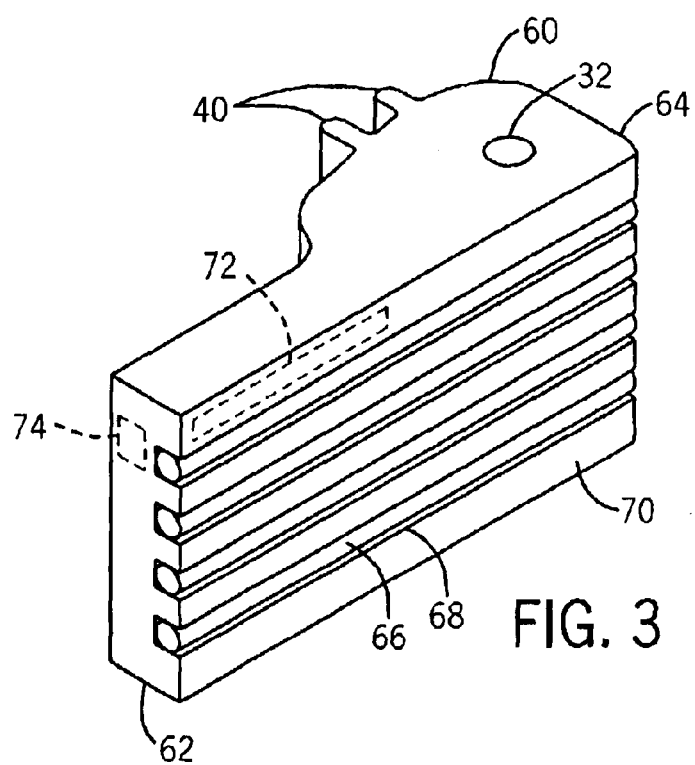
FIG. 3 is a perspective view of an embodiment of an ejector handle in accordance with the present invention.

FIG. 3 illustrates an alternate embodiment of an ejector handle 60 with a distal end 62 and an end 64, which in the seated or operational position, will be substantially adjacent to the front surface of the faceplate of an associated electronic circuit card in an electronic shelf. The ejector handle 60 contains a plurality of parallel, coplanar, light pipes 66 disposed in corresponding channels 68 along and external surface 70 of the ejector handle. Thus, the light pipes 66 are easily installed in channels 68 in handle 60. It will be noted that the light pipes in ejector handles 16 and 18 are interior of the external surfaces and thus require holes or passages to be fabricated as part of the ejector handles. Labels designating the functions associated with the light pipes can be disposed on the ejector handles. For example as shown in FIG. 3, a label can be printed adjacent each light pipe in an area such as 72 along the length of the handle, or can be printed or embossed at an area 74 on the distal end 62 of the ejector handle. Such labels can also be affixed to similar locations for ejector handles 16 and 18.

If light pipes 66 are designed to provide some degree of internal dispersion, taper, or side emission, the status indication not only appears as a bright spot at the distal end of handle 60, but also as an illuminated stripe along its entire length. If a label with a transparent or translucent background is located directly over such a side emitting light pipe, the label will appear backlit, providing an excellent user interface.

In accordance with embodiments of the present invention, more of the front surface of faceplate 14 is available for other uses since visual status indicators and associated labels are located on the ejector handles themselves.

Although embodiments of the present invention have been described and shown in the drawings, various modifications can be made to the illustrative embodiments. For example, the visual indicator assembly could comprise LEDs mounted to a small board extending from printed circuit card 12 so that each of the LEDs was aligned with and close to the respective ends of light pipes in the injector handle when the injector handle is in the seated position. Various types of light sources can be utilized such as incandescent bulbs, lasers and various types of solid-state light emitting devices. The ejector handles can comprise different shapes and can provide leverage without being pivotally mounted, e.g. appropriately designed ejector handles could slide or hinge. These alternative designs are described to illustrate a few of the various modifications that can be made. The scope of the invention is defined by the claims that follow.

We claim:

1. An electronic assembly comprising:

an electronic circuit card;

a faceplate mounted to the electronic circuit card;

at least one ejector handle mounted adjacent the faceplate, said ejector handle movably mounted substantially at one end of the ejector handle to provide leverage in disengaging the electronic circuit card from a connector;

visual indicator assembly mounted to the electronic circuit card;

at least one light pipe disposed in the at least one ejector handle, said light pipe having a first end disposed at said one end of the ejector handle to receive light from the visual indicator assembly and an opposing end disposed at an opposing end of the ejector handle opposite the one end of the ejector handle to exit light from the ejector handle.

2. The assembly of claim 1 wherein the visual indicator assembly includes at least one light source mounted to the electronic circuit card and another light pipe disposed to couple light from the light source to the first end of the at least one light pipe.

3. The assembly of claim 2 wherein the another light pipe has a substantially 90 degree bend and couples light from the light source that is mounted to the surface of the electronic circuit card.

4. The assembly of claim 1 wherein said ejector handle is pivotally mounted such that the first end of the at least one light pipe is disposed to allow light to exit from the visual indicator assembly when said ejector handle is in a seated position with the electronic circuit card engaging the connector.

5. The assembly of claim 1 further comprising a plurality of light pipes disposed along the at least one ejector handle, each of said light pipes having an end disposed at said one end of the ejector handle to receive light from the visual indicator assembly.

6. The assembly of claim 5 wherein the plurality of light pipes are disposed substantially parallel to each other in the at least one ejector handle.

7. The assembly of claim 1 further comprising indicia disposed on the surface of the ejector handle substantially adjacent to at least one light pipe, the indicia providing a label identifying a function associated with the at least one light pipe.

8. The assembly of claim 1 wherein the faceplate has at least one aperture disposed to align with the first end of the at least one light pipe in the ejector handle to facilitate the transmission of light from the visual indicator assembly to the one end.

9. The assembly of claim 1 wherein the ejector handle is elongated from the one end of the ejector handle to the opposing end of the ejector handle and the light pipe extends alone the elongate length of the ejector handle so that light exits substantially from said opposing end.

10. The assembly of claim 1 wherein said at least one light pipe is disposed on the handle so that a substantial length of the one light pipe is seen, the substantial length of the one light pipe being constructed to emit light along said substantial length.

11. The assembly of claim 10 further comprising a label capable of being backlit disposed along said substantial length of the one light pipe.

12. An ejector handle designed for mounting to and providing leverage for removing an electronic circuit card from engagement with a connector when the electronic circuit card is seated within an electronic shelf, the ejector handle comprising:

a body including a handle portion;

means associated with the body for facilitating movement of the body relative to the electronic shelf;

means of said body for engaging the electronic shelf in order to apply force on the electronic circuit card relative to the electronic shelf to aid in removal of the electronic circuit card from the electronic shelf;

at least one light pipe disposed in the body, where the light pipe has a first end disposed to receive light at a portion of the body adjacent the electronic circuit card when the electronic circuit card is seated within the electronic shelf and also has an opposing end from which light exits disposed at a distal end of the handle portion of the body;

a plurality of light pipes disposed in the body, each of the light pipes having a first end disposed to receive light at a portion of the body adjacent to the electronic circuit card when the electronic circuit card is seated within the electronic shelf, each of the light pipes having an opposing end from which light exits disposed at a distal end of the handle portion of the body.

13. The ejector handle of claim 12 wherein the plurality of light pipes are disposed substantially parallel to each other in the body.

14. The ejector handle of claim 12 further comprising indicia disposed on the surface of the handle portion of the body substantially adjacent to at least one light pipe, the indicia providing a label identifying a function associated with the at least one light pipe.

15. The ejector handle of claim 12 further comprising means associated with said opposing end of each of the plurality of light pipes for improving dispersion of light exiting the opposing end.

16. The ejector handle of claim 12 wherein said at least one light pipe is disposed on the handle portion of the body so that a substantial length of the one light pipe is seen, the substantial length of the one light pipe being constructed to emit light along said substantial length.

17. The ejector handle of claim 16 further comprising a label capable of being backlit disposed along said substantial length of the one light pipe.

18. An electronic assembly comprising:

an electronic circuit card;

a faceplate mounted to the electronic circuit card;

at least one ejector handle mounted adjacent the faceplate, said ejector handle movably mounted to provide leverage in disengaging the electronic circuit card from a connector;

visual indicator assembly mounted to the electronic circuit card;

at least one light pipe disposed in the at least one ejector handle, said light pipe having a first end disposed to receive light from the visual indicator;

said at least one light pipe disposed along the length of the handle so that a substantial length of the one light pipe is seen, the substantial length of the one light pipe being constructed to emit light along said substantial length;

a label capable of being backlit disposed along said substantial length of the one light pipe.

19. The assembly of claim 18 wherein said ejector handle is movably mounted substantially at one end of the ejector handle, said first end of the light pipe is disposed at said one end of the ejector handle to receive light from the visual indicator assembly.

* * * * *